(12) United States Patent
Richert et al.

(10) Patent No.: US 7,094,993 B2
(45) Date of Patent: Aug. 22, 2006

(54) APPARATUS AND METHOD FOR HEATING AND COOLING AN ARTICLE

(75) Inventors: Carson T. Richert, Corona, CA (US); Luis Alejandro Rey Garcia, Long Beach, CA (US); Dienhung D. Phan, Westminster, CA (US); Selina De Rose-Juarez, Corona, CA (US); Andrei Szilagyi, Rancho Palos Verdes, CA (US)

(73) Assignee: Radiant Technology Corp., Fullerton, CA (US)

( * ) Notice: Subject to any disclaimer, the term of this patent is extended or adjusted under 35 U.S.C. 154(b) by 0 days.

(21) Appl. No.: 10/968,844

(22) Filed: Oct. 19, 2004

(65) Prior Publication Data

US 2005/0109759 A1    May 26, 2005

Related U.S. Application Data

(63) Continuation of application No. 10/789,415, filed on Feb. 27, 2004, which is a continuation of application No. 10/321,026, filed on Dec. 16, 2002, now abandoned, which is a continuation of application No. 09/755,812, filed on Jan. 5, 2001, now Pat. No. 6,495,800, which is a continuation-in-part of application No. 09/645,772, filed on Aug. 23, 2000, now Pat. No. 6,501,051.

(60) Provisional application No. 60/150,986, filed on Aug. 23, 1999.

(51) Int. Cl.
*B23K 3/08* (2006.01)
*F27B 9/24* (2006.01)
*F27B 9/36* (2006.01)

(52) U.S. Cl. .................. 219/388; 219/411; 219/413; 228/180.1; 228/180.22

(58) Field of Classification Search ................ 219/388, 219/400; 228/102, 180.22
See application file for complete search history.

(56) References Cited

U.S. PATENT DOCUMENTS

| | | |
|---|---|---|
| 2,056,207 A | 10/1936 | Piazzoli, Jr. |
| 2,334,865 A | 11/1943 | Crawford |
| 2,674,809 A | 4/1954 | Meienhofer |
| 2,981,819 A | 4/1961 | Gregory |
| 3,415,503 A | 12/1968 | Beck |
| 3,436,524 A | 4/1969 | Pauls |
| 3,515,854 A | 6/1970 | Williams |
| 3,596,125 A | 7/1971 | Seigel |
| 3,603,827 A | 9/1971 | Degawa, et al. |
| 3,619,682 A | 11/1971 | Lo, et al. |
| 3,739,215 A | 6/1973 | Murai |

(Continued)

FOREIGN PATENT DOCUMENTS

EP    0 108 314    5/1984

(Continued)

*Primary Examiner*—Joseph Pelham
(74) *Attorney, Agent, or Firm*—Christie, Parker & Hale, LLP.

(57) ABSTRACT

An apparatus for heating and cooling an article is provided. The apparatus comprises an enclosure having top, bottom, and side walls and an entrance and an exit. A first belt system comprising one or more belts extends from a loading position through a portion of the enclosure. The first belt system has a loading end and an unloading end. A second belt system comprising one or more belts extends from the unloading end of the first belt system to an unloading position. The second belt system has a loading end and an unloading end. The enclosure includes one or more heating sources positioned adjacent the first belt system for heating the first belt system.

34 Claims, 5 Drawing Sheets

U.S. PATENT DOCUMENTS

| | | | |
|---|---|---|---|
| 3,798,061 A | 3/1974 | Yamazaki | |
| 3,818,181 A | 6/1974 | Benard | |
| 3,836,751 A | 9/1974 | Anderson | |
| 3,851,200 A | 11/1974 | Thomasson | |
| 3,867,660 A | 2/1975 | Fohl | |
| 3,882,596 A * | 5/1975 | Kendziora et al. | 228/102 |
| 4,000,407 A | 12/1976 | Keller et al. | |
| 4,025,811 A | 5/1977 | Van Nes | |
| 4,100,418 A | 7/1978 | Brown, Jr. | |
| 4,101,424 A | 7/1978 | Schooley et al. | |
| 4,101,759 A | 7/1978 | Anthony et al. | |
| 4,244,285 A | 1/1981 | Baker | |
| 4,245,613 A | 1/1981 | Wells et al. | |
| 4,321,031 A * | 3/1982 | Woodgate | 219/388 |
| 4,323,810 A | 4/1982 | Horstmann | |
| 4,389,562 A | 6/1983 | Chaudoir | |
| 4,406,944 A | 9/1983 | Crain et al. | |
| 4,435,445 A | 3/1984 | Allred et al. | |
| 4,460,821 A | 7/1984 | Crain et al. | |
| 4,477,718 A | 10/1984 | Crain et al. | |
| 4,517,448 A * | 5/1985 | Crain et al. | 219/388 |
| 4,558,660 A | 12/1985 | Nishizawa et al. | |
| 4,820,906 A | 4/1989 | Stultz | |
| 4,833,301 A * | 5/1989 | Furtek | 219/388 |
| 4,856,458 A | 8/1989 | Yamazaki et al. | |
| 4,876,437 A * | 10/1989 | Kondo | 219/388 |
| 4,994,705 A | 2/1991 | Linder et al. | |
| 4,997,364 A | 3/1991 | McGrath et al. | |
| 5,008,593 A | 4/1991 | Schlie et al. | |
| 5,039,841 A * | 8/1991 | Kato et al. | 219/388 |
| 5,048,719 A * | 9/1991 | Empl et al. | 221/119 |
| 5,094,010 A | 3/1992 | Jacobi et al. | |
| 5,147,130 A | 9/1992 | Watanuki | |
| 5,259,546 A * | 11/1993 | Volk | 228/102 |
| 5,289,968 A * | 3/1994 | Maeda et al. | 228/223 |
| 5,325,601 A | 7/1994 | Brownewell et al. | |
| 5,340,089 A | 8/1994 | Heath et al. | |
| 5,372,781 A | 12/1994 | Hallett et al. | |
| 5,387,546 A | 2/1995 | Maeda et al. | |
| 5,409,155 A * | 4/1995 | Chen | 228/232 |
| 5,433,368 A * | 7/1995 | Spigarelli | 228/102 |
| 5,481,087 A * | 1/1996 | Willemen | 219/388 |
| 5,504,666 A | 4/1996 | Carmichael | |
| 5,505,912 A | 4/1996 | Hallett | |
| 5,516,031 A * | 5/1996 | Nishikawa et al. | 228/102 |
| 5,607,609 A | 3/1997 | Sakuyama et al. | |
| 5,615,614 A * | 4/1997 | Van Pelt | 219/388 |
| 5,840,600 A | 11/1998 | Yamazaki et al. | |
| 5,864,119 A | 1/1999 | Vogt et al. | |
| 5,970,384 A | 10/1999 | Yamazaki et al. | |
| 6,018,144 A | 1/2000 | Vogt et al. | |

FOREIGN PATENT DOCUMENTS

| | | | |
|---|---|---|---|
| JP | 02-263569 A * | 10/1990 | |
| JP | 03-64095 A * | 3/1991 | |
| JP | 03-77772 A * | 4/1991 | |
| JP | 4-262861 | 9/1992 | |
| WO | WO 87/03077 | 5/1987 | |

* cited by examiner

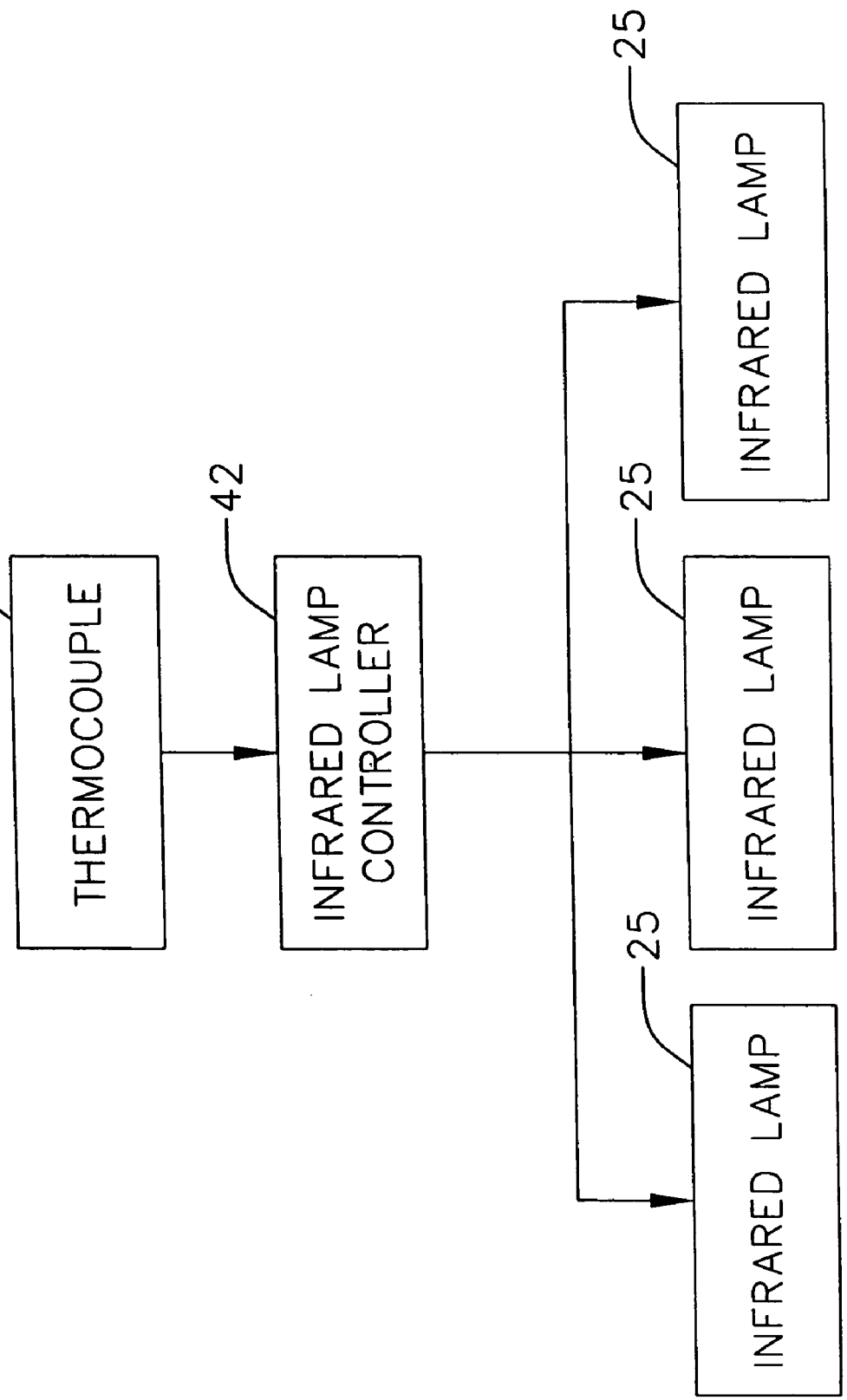

APPARATUS AND METHOD FOR HEATING AND COOLING AN ARTICLE

CROSS-REFERENCE TO RELATED APPLICATIONS

This application is a continuation of application Ser. No. 10/789,415, filed Feb. 27, 2004, which is a continuation of application Ser. No. 10/321,026, filed on Dec. 16, 2002 now abandoned, which is a continuation of U.S. application Ser. No. 09/755,812, filed on Jan. 5, 2001 (now U.S. Pat. No. 6,495,800), which is a continuation-in-part of U.S. application Ser. No. 09/645,772, filed on Aug. 23, 2000 (now U.S. Pat. No. 6,501,051), which claims the benefit of Provisional Application No. 60/150,986, filed on Aug. 23, 1999, the entire disclosures of which are hereby incorporated by reference.

BACKGROUND

"Wafer bumping" refers to a semiconductor packaging technology that prepares microchips for flip chip attachment onto an integrated circuit package or other electronic assembly. There are numerous different methods of wafer bumping, but the process typically involves placing tiny amounts of electrically conductive material onto the input/output pads of a wafer and then subjecting the wafer assembly with the electrically conductive material to a thermal process known as mass solder reflow. Controlling the wafer temperature is critically important to allow the solder to reflow while at the same time preventing damage to the wafer.

One prior art method of performing a solder reflow process is known in the industry as hot-plate technology. Hot-plate technology utilizes conduction, where the wafer is placed on a flat thermal mass precisely maintained at a given temperature. Conduction heating of the type employed in hot-plate technology is beneficial because the temperature of the wafer will not go higher than the temperature of the thermal mass (hot-plate) on which the wafer is sitting. Traditionally, hot-plate technology requires a system having multiple isolated hot plate stages and a means of moving the wafer to be reflowed from stage to stage to achieve proper heating.

There are several disadvantages to the prior art hot-plate type reflow system. First, because of their thermal mass, hot plates are slow to heat up and to cool down. Therefore, a lot of production time is lost when it is necessary to change set point temperature for a high temperature solder alloy to a lower temperature for a low temperature solder. Second, a pusher bar is typically used to push wafers from stage to stage. Spacing between pusher bars are established for a particular sized wafer, for example, eight-inch and twelve-inch wafers, etc. If the equipment is used with smaller wafers than it was designed for, production capacity is lost. Third, fluxes residues are formed from the wafers as they are heated, and the fluxes residues accumulate on plate surfaces. One source of flux is an organic acid that is put on a wafer to provide viscosity and to remove oxides on metal surface that inhibit good electrical connections. When passing through the various hot plates, the wafers get dirty from being pushed through the condensed fluxes, and have to be cleaned in an additional, costly step.

Fourth, commercially available hot plate equipment does not provide a controlled atmosphere surrounding the reflow and cooling areas that is capable of maintaining an inert atmosphere or reactive gas atmosphere that contains less than five parts per million oxygen molecules, and so allowing oxidation to occur. Fifth, the gas that is used in the prior art systems to control atmosphere causes wafer movement which makes in line processing using cassette to cassette loading equipment more difficult to use. Sixth, the condensed fluxes must frequently be manually removed from numerous parts of the hot-plate equipment causing significant lost production time and considerable expense.

SUMMARY OF THE INVENTION

The present invention is directed to an apparatus and method for heating and cooling an article, such as a microchip. The apparatus and method of the invention are particularly useful for reflowing solder on a microchip, but can be used for a variety of other applications.

In one embodiment, the invention is directed to an apparatus for heating and cooling an article. The apparatus comprises an enclosure having top, bottom, and side walls and an entrance and an exit. A first belt system comprising one or more belts extends from a loading position through a portion of the enclosure. The first belt system has a loading end and an unloading end. A second belt system comprising one or more belts extends from the unloading end of the first belt system to an unloading position. The second belt system has a loading end and an unloading end. The enclosure includes one or more heating sources positioned adjacent the first belt system for heating the first belt system.

In another embodiment, the invention is directed to an apparatus comprising an enclosure having top, bottom, and side walls and an entrance and an exit. At least a portion of the top, bottom and/or side walls comprise porous insulation. A first belt system comprising one or more belts extends from a loading position outside the enclosure, through the entrance of the enclosure and through a portion of the enclosure. The first belt system has a loading end and an unloading end. A second belt system comprising one or more belts extends from the unloading end of the first belt system and through the exit of the enclosure to an unloading position outside the enclosure. The second belt system has a loading end and an unloading end. One or more heating sources are positioned below the first belt system for heating the first belt system. The apparatus further includes means for blowing cooling gas onto the second belt system.

In yet another embodiment, the invention is directed a method for heating and cooling an article. The method comprises placing the article on a loading end of a first belt system comprising one or more belts extending from a loading position and through an enclosure to an unloading end of the first belt system within the enclosure. The article is transported on the first belt system through the enclosure to the unloading end while the first belt system is being heated to thereby heat the article. The article is transferred to a loading end of a second belt system comprising one or more belts extending from the unloading end of the first belt system and to an unloading position. The second belt system is at a temperature lower than the temperature of the first belt system. The article is transported on the second belt system to thereby cool the article.

In still another embodiment, the invention is directed to a method for heating and cooling an article. The method comprises placing the article on a loading end of a first belt system comprising one or more belts extending from a loading position into an enclosure to an unloading end of the first belt system within the enclosure. The article is transported on the first belt system through an entrance of the enclosure to the unloading end while the first belt system is being heated to thereby heat the article. The temperature of the first belt system is measured. The article is transferred to a loading end of a second belt system comprising one or more belts extending from the unloading end of the first belt system and to an unloading position outside the enclosure. The second belt system is at a temperature lower than the temperature of the first belt system. The article is transported on the second belt system and cooling gas is blown onto the second belt system to thereby cool the article.

BRIEF DESCRIPTION OF THE DRAWINGS

These and other features and advantages of the present invention will be better understood by reference to the following detailed description when considered in conjunction with the accompanying drawings wherein:

FIG. 5 is a flow diagram showing the relationship of the thermocouple to the infrared lamp control.

DETAILED DESCRIPTION

Figure 1:
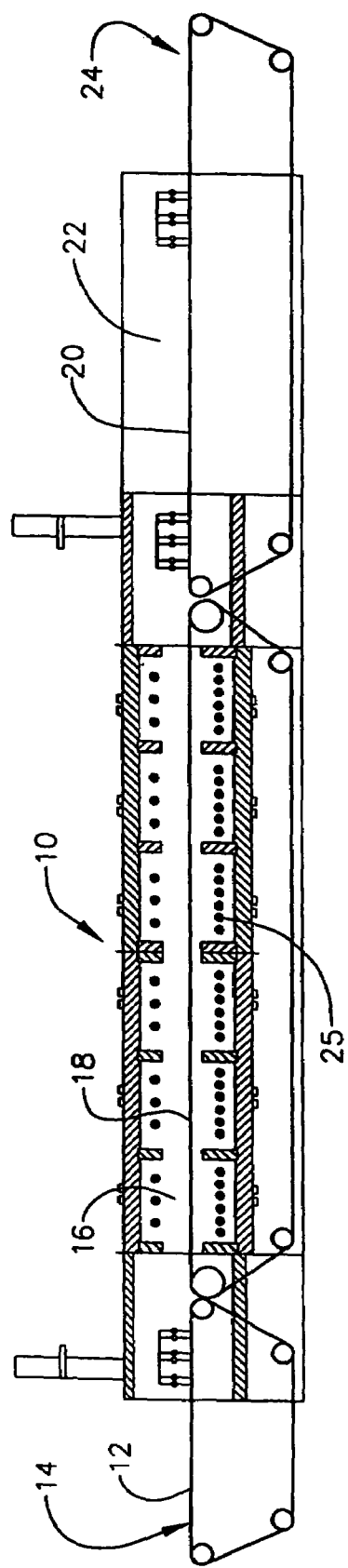
FIG. 1 is a side cross-sectional overview of a continuous-conduction wafer bump reflow system according to an embodiment of the current invention.

FIG. 1 shows an overview of a wafer bump reflow furnace 10 according to one embodiment of the present invention. The furnace utilizes three separate conveyer belts to transport wafers through the furnace 10. A loading belt 12 transports wafers from a loading station 14 through a baffle into a heating chamber 16 having a controlled atmosphere. A hot belt 18 transports wafers through the heating chamber 16, where the reflow process occurs. While transporting the wafer through the heating chamber 16, the hot belt 18 acts as a moving hot plate heating the wafer through conduction. The temperature of the hot belt 18 changes as the hot belt passes through different stages in the heating chamber 16. A cooling belt 20 receives each wafer from the hot belt, and moves the wafer through a cooling area 22 still within a controlled atmosphere, thus immediately cooling the wafer. The cooling 20 belt transports the wafer through a baffle back into room atmosphere to an unloading station 24 where the wafer is removed from the cooling belt.

In one embodiment of the present invention, the basic structure of the furnace is consistent with that described in U.S. Pat. No. 4,517,448 to Crain et al., the contents of which are incorporated herein by reference. In an embodiment, the furnace has a pedestal upon which is provided a lower framework having access doors. Mounted on the top of the lower framework, inwardly from the ends thereof, is a shorter upper framework. The enclosure for the upper framework is also provided with access doors. A heating chamber is supported within the lower and upper frameworks.

Mounted within the pedestal is a computer which allows a user to program the temperature in different zones along a length of the heating chamber. The computer is electrically connected to a digital controller, also located within the pedestal, that monitors and controls the temperature in the different zones along the length of the heating chamber. Also mounted in the pedestal is an electric fan for drawing cooling air entering an opening in the pedestal, past electronic power circuits enclosed therein. Mounted on the top of the upper framework is a display screen for data entry and display.

The heating chamber is an elongated rectangularly shaped enclosure having its upper and lower walls constructed of sheets of insulation, and having its side walls constructed of sheets of insulation. The heating chamber 16 is divided by the hot belt 18 and insulation surrounding the hot belt. The hot belt 18 is supported to ride within the heating chamber on three quartz tubes which extend throughout the length of the heating camber and rest on three semicircular grooves provided on the end walls. The sheets of insulation are formed by compressing a heat insulating material such as a white alumina fiber so that it forms a porous structural wall having a relatively smooth surface. An upper plenum chamber is formed between the top of the heating chamber and the top of the upper rectangular framework. In an additional embodiment, a lower plenum chamber is formed between the bottom of the heating chamber and the bottom of the lower rectangular framework.

A cover gas which may be nitrogen or hydrogen for example, may be fed under a low pressure to the plenum chamber above the heating chamber 16. A system for administering a cover gas to the system is described in U.S. Pat. No. 4,517,448. In this system, the cover gas slowly and evenly filters through the porous sheets of insulation which form the top and bottom walls of the heating chamber 16, thus causing the interior of the heating chamber to be at a slightly higher pressure than the atmosphere surrounding the infrared furnace. The increased pressure in the heating chamber 16 keeps unwanted air from entering the heating chamber and causing unwanted reactions.

Each of the side walls of the heating chamber is provided with circular holes both above and below the heating belt. A plurality of elongated infrared lamps 25 are mounted within the circular holes. A mounting for the infrared lamps 25 is disclosed in U.S. Pat. No. 4,517,448. Other types of lamps, using other wavelengths of light for example, may be employed to heat the hot belt 18 as it passes over. Each lamp is located either above or below the heating belt, and the lamps below the belt can be operated independently of the lamps above the belt.

As will be explained later, the infrared lamps located below the hot belt 18 are used to heat the hot belt 18 and the wafer resting on top of the hot belt 18 to a desired temperature. The infrared lamps 25 located above the hot belt 18 are used to greatly elevate the temperature of the hot belt 18, when no wafers are being treated, to burn off any fluxes residues, thus performing a self-cleaning function.

Additional pieces of insulation are affixed below the hot belt 18 perpendicular to the direction of belt travel at preselected intervals to create isolated stages. Each isolated stage has infrared lamps that are controlled to heat the hot belt to a preset temperature.

Figure 2:
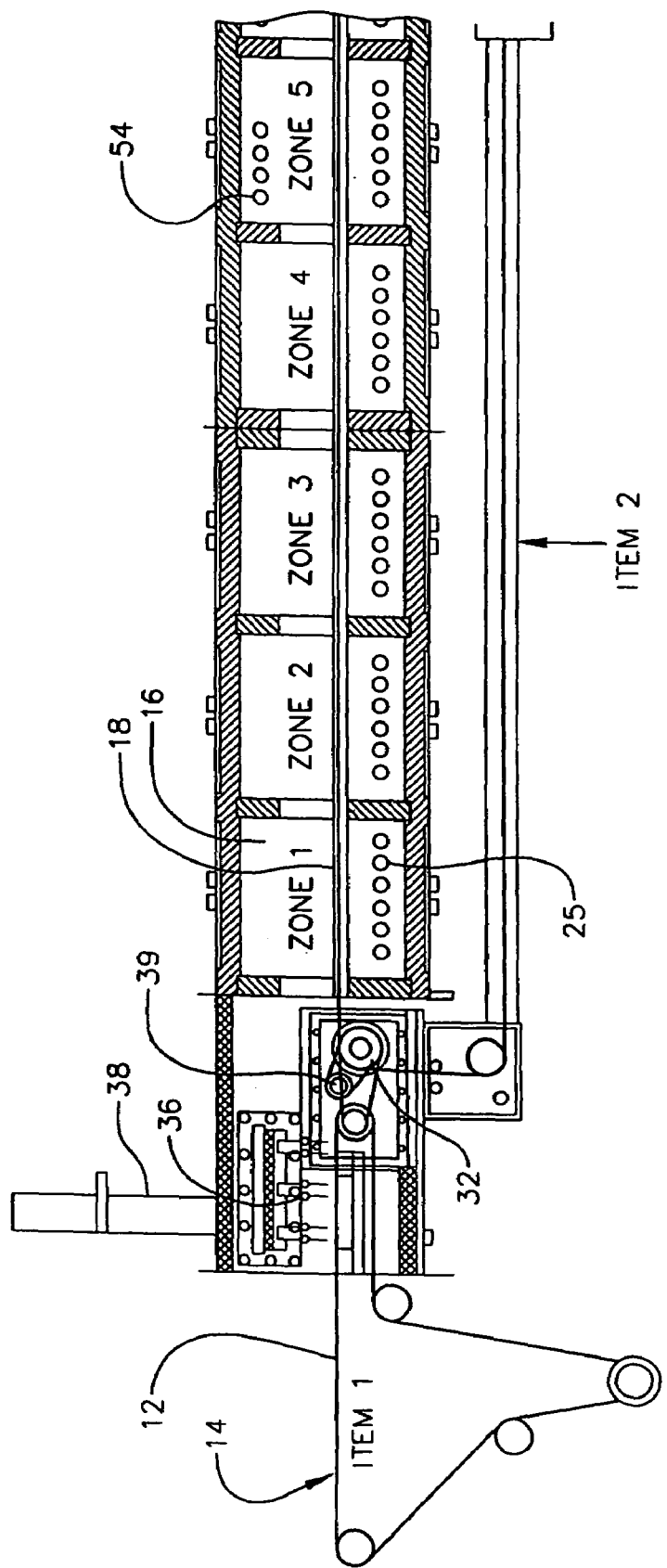
FIG. 2 is a side cross-sectional view of a first half of a continuous-conduction wafer bump reflow system according to an embodiment of the current invention.
Figure 3:
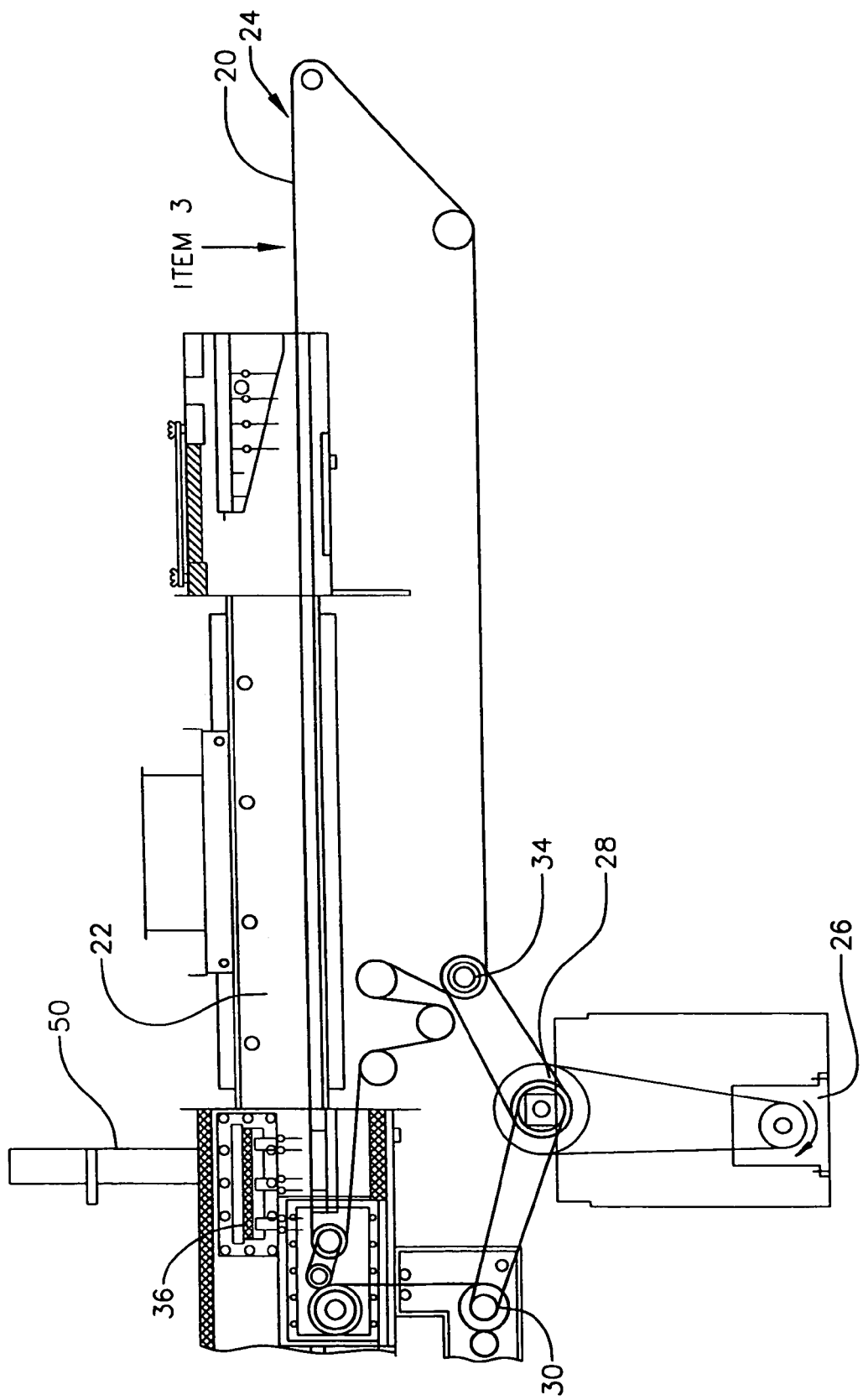
FIG. 3 is a side cross-sectional view of a second half of a continuous-conduction wafer bump reflow system according to an embodiment of the current invention.

FIGS. 2 and 3 show the furnace in more detail. All three belts are coupled to a motor 26. The motor 26 is coupled to a first pulley 28 that in turn is coupled a hot belt pulley 30. The hot belt 18 is coupled to the hot belt pulley 30 and turns a loading belt pulley 32. The loading belt pulley 32 turns the loading belt 12. The first pulley 28 is also coupled to a cooling belt pulley 34. The cooling belt pulley 34 turns the cooling belt 20.

FIG. 2 shows the loading Station 14 and the loading belt 12 in more detail. In one embodiment of the present invention, the loading belt is made of a loose weave stainless steel. As shown in FIG. 2, the loading belt 12 passes into the heating chamber 16. The loading belt 12 is approximately 30 inches long with one end in the loading station 14. In one embodiment, wafers are loaded onto the loading belt 12 by hand. In an alternative embodiment of the present invention, wafers are loaded automatically. In an embodiment of the present invention, the wafers are stored in a cassette, such as the IX111 Indexer made by Mantis Robotics Corporation and are automatically loaded onto the loading belt 12 individually at set intervals.

Once a wafer is loaded onto the loading belt 12, the wafer travels through a loading baffle 36 and enters the heating chamber 16. The loading baffle 36 keeps any room air from entering into the heating chamber 16. An exemplary baffle is described in U.S. Pat. No. 4,517,448. In one embodiment, the loading baffle 36 comprises a stationary physical barrier to prevent room atmosphere from entering the furnace. The loading baffle 36 also contains air knives that function by jetting an inert gas downward toward the loading belt 12, forming a barrier to prevent room air from entering into the tunnel. In an additional embodiment there are air knives oriented upward that jet an inert gas upward toward the loading belt 12.

Also in the loading portion of the heat chamber 16 is an exhaust duct and chimney 38. An exemplary exhaust duct and chimney 38 is described in U.S. Pat. No. 4,517,448. In an embodiment of the present invention, an upward draft is created in the exhaust chimney by blowing a gas upward and out of the top of the exhaust chimney. The blowing of a gas upward and out of the exhaust chimney creates suction to draw exhaust gasses from the heating chamber and send these exhaust gasses out of the exhaust chimney. As some of the gas from the heating chamber reaches the exhaust duct and chimney, the gas is cooled and waste products in the gas condense out onto the walls of the exhaust duct and chimney.

Below the chimney is a plate 27 that collects the drippings of the exhaust gasses that condense at the bottom of the exhaust chimney. The plate 27 may be removed for cleaning by removing an outer panel of the upper frame. The use of a controlled atmosphere and an exhaust chimney prevents oxidation and removes the fluxes that evaporate off of the wafer during the reflow process. The controlled atmosphere may comprise for example, nitrogen or hydrogen. In an alternative embodiment, the controlled atmosphere comprises clean, dry air ("CDA").

After passing through the loading baffle 36 and beyond the drip plate 27, the loading belt terminates and the hot belt 18 begins. In an embodiment of the present invention an idler bar 39 assists the wafer from the loading belt 12 to the hot belt 18. Although the gap between the belts may be made quite small, the idler bar 39 ensures a smooth transition between belts for treating particularly small wafers or chips. Typically, the idler bar 39 turns at a rate equal to or greater than the speed of the loading and hot belts, and is turned using a pulley system that is turned by one of belts. The idler bar 39 prevents the end of relatively small wafers from dipping and being damaged as the wafers reach the end of the loading belt.

Figure 4:
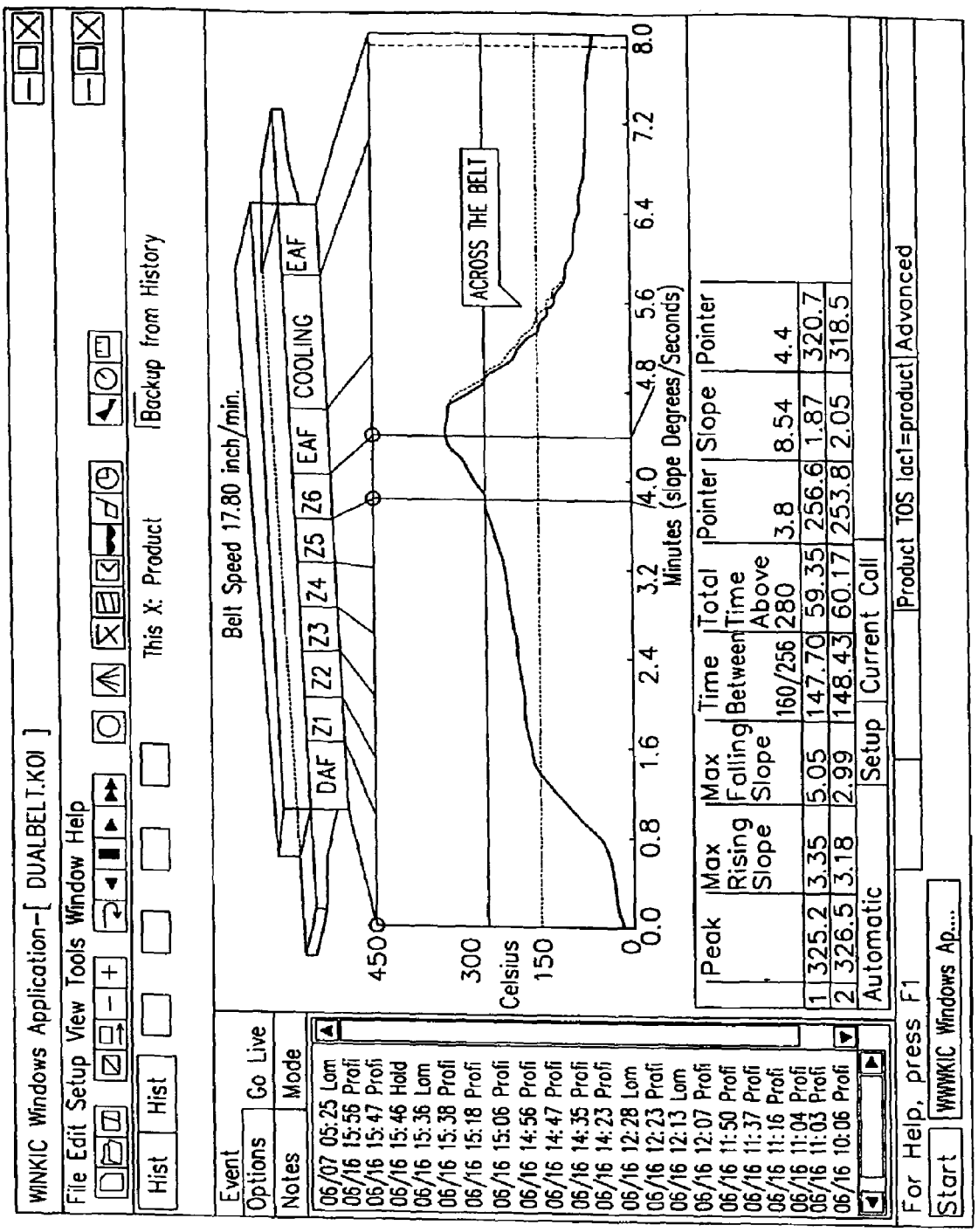
FIG. 4 is a screen shot from the computer of one embodiment of the present invention showing a reflow heating profile.

In an embodiment of the present invention, the hot belt 18 is made of a tight weave stainless steel. As shown in FIG. 2, the hot belt, and the wafer riding on top of it, travels through a staged heating chamber 16 to carry out a solder reflow process. A typical solder reflow process, as shown in FIG. 4, involves three steps. First, there is an initial ramp step where the temperature of the wafer is slowly raised to drive out moisture and activate chemical reduction processes in the solder. Next, there is an intermediate soak step to homogenize the temperature distribution across the wafer. And finally, there is a "spike" step where the temperature of the wafer is quickly raised slightly above the melting point of the solder and then immediately allowed to cool.

The heating chamber 16 is divided up into stages to accommodate a profiled heating process such as a solder reflow process. The heating chamber 16 may be made as long as desired, and can be divided into as many stages as desired. In one embodiment, the heating chamber 16 is divided up into 6 different stages. Each stage has a segmented off area containing infrared lamps that heat only the portion of the hot belt that is traveling through the stage. Each stage is insulated from other stages and from the area of the furnace above the belt, so that the heating is isolated to the specific stage, and so that as little stray infrared light as possible reflects onto the wafer and imparts heat. The direct light from the heat lamps and the light reflected off the insulation contained below the hot belt 18 in the stage heats the portion of the hot belt 18 passing over the stage up to a specific predefined temperature.

In summary, the weave of hot belt 18 is preferably tight enough to block passage of most of the infrared radiation from lamps 25. (Typically, the blockage is as much as 99% of the radiation.) This infrared radiation is absorb by the surface of hot belt 18 and thus raises its temperature and transfers heat to the wafer by conduction. Loading belt 12 and cooling belt 20, on the other hand, do not block the infrared radiation because they are not in the path of lamps 25 and thus they may have a loose weave. In fact, it is preferably for cooling belt 20 to have a loose weave to promote more rapid cooling.

Infrared lamps are preferred as the heat source because they can be controlled to rapidly change the energy delivered to the wafers being processed in the manner described in FIG. 5 below.

The infrared lamps of each stage are preset to different strengths in order to heat the portion of the hot belt to different temperatures as the portion of the hot belt passes through each stage, thus enabling the furnace to create an optimum reflow profile. As shown in FIG. 5, a thermocouple 40 is provided in each stage to get an accurate reading of the temperature of the hot belt 18 within the stage. In one embodiment of the present invention, a thermocouple consists of two wires made of different materials that produce different electromotive forces when heated. Both wires are connected to a piece of copper. The piece of copper is positioned in a fixed location to be in constant contact with the belt as the belt moves past the piece of copper. As the belt heats the copper, the copper heats the two wires of different materials, thus producing different electric potentials in each of the two wires. The measurable difference in potential is proportional to the temperature of the belt. A thermocouple 40 is connected to a digital controller 42 that alters the intensity of the infrared lamps in a given stage to achieve the desired temperatures as programmed by a user.

The number of stages may be altered depending on the heating profile desired which is in turn based upon the characteristics of the item being treated. As shown in FIG. 4, a user may manipulate the heating profile using software executing on the system's computer. In one embodiment, the software allows a user to preprogram the temperature at each stage of the heating chamber using a data input device such as a keyboard or a mouse. In an additional embodiment of the present invention, the user may also manipulate the speed of the hot belt to alter the amount of time that the wafer spends in each stage to further alter the heating profile.

In another alternative embodiment, the user can manipulate the speed of each of the three belts independently of the other two.

Once the user has selected the desired temperatures in each stage and the speed of the belts, the computer software communicates the settings to the digital controller 42. In one embodiment, the digital controller 42, which is housed in the pedestal, is an Opto 22 digital control system with a temperature control system. The digital controller 42 constantly compares the actual temperature in each stage, as determined by a thermocouple, to the preset temperature and alters the power to the infrared lamps in each stage accordingly. In one embodiment of the present invention, the digital controller alters the power to the infrared lamps through a silicon controlled rectifier ("SCR").

Once the temperature and belt speed settings have been communicated to the digital controller, a user may run a test on the system by attaching one or more traveling thermocouples to a wafer that is being run through the system. The one or more traveling thermocouples communicate the temperature of the wafer at a given a given point in time. A program, such as the KIC Prophet System, samples the temperature as determined by the one or more traveling thermocouples at numerous times as the wafer passes through the heating chamber and then produces a graph of the temperature of the wafer corresponding to time. By looking at the generated graph, which is displayed on the display screen, an operator can determine whether the heating profile that actually occurs within the system is desirable and can make any necessary adjustments to the temperatures in the various stages or to the belt speed.

Different heating profiles may be desirable depending on the solder being used. For example, some solders are classified as "high temperature" solders. Typically, "high temperature" solders comprise about 95% tin and about 5% lead, and melt at approximately 330° C. Some solders are classified as "low temperature" solders. "Low temperature" solders typically comprise about 63% lead and about 37% lead, and melt at approximately 183° C. Eutectic solders are often used because they retain their hardness until they reach their exact melting temperature and therefore, their behavior can be predicted accurately.

It is important to have gradual heating, because if the wafer is heated too rapidly, the solder paste could erupt from steam formed by evaporating moisture inside of the paste. In a typical heating profile for low temperature solder, the wafer is heated at a maximum rate of about 1 to 2° C. per second, up until about 170° C. when equilibrium is allowed to occur. From about 170° C. the temperature is quickly elevated above the melting temperature of the solder by moving the second conveyor belt through appropriate heated stages. The wafer is kept at the elevated melting temperature for a given period of time, for e.g. 30 seconds, and then transferred to the cooling belt 20, where the wafer immediately cools to below the melting temperature.

As shown in FIG. 4, the heating of the hot belt becomes most intense near the end of the heating chamber to form a spike. The goal of the spike is to have the temperature of the hot belt and the wafer on top of the belt reach the optimum reflow temperature (and no higher) for the optimal period of time. The speed of the hot belt is also adjustable depending on the type of solder being used and the size of the wafer and chips being treated. In one embodiment of the present invention, the reflow temperature is reached just as the hot belt approaches a cooling belt.

In an embodiment of the present invention, all three conveyor belts are made of stainless steel. Stainless steel is a relatively poor conductor of heat. In addition, because the belt is not a solid piece of material, but rather a mesh, when one area of the second conveyor belt passes over a heating stage with an elevated temperature, the heated portion of the hot belt 18 does not conduct heat back into the portion of the hot belt 18 located over the cooler stages. The conveyor belts may also be made of other materials that have heating characteristics similar to stainless steel.

The hot belt 18 is coupled to the cooling belt 20 at the end of the heating chamber 16. In an embodiment a second idler bar 39 aids in the transition from the hot belt 18 to the cooling belt 20. The second idler bar 39 functions the same as the idler bar 39 between the loading belt 12 and the hot belt 18 described above. Although the gap between the hot belt 18 and the cooling belt 20 can be made small, the idler bar 39 is particularly helpful when the wafers or chips to be manipulated are small.

The cooling belt 20 is maintained at a cool temperature, so that once on the cooling belt the wafer is immediately brought below the reflow temperature and the reflow terminated. The cooling belt 20 is a relatively loose weave which further aids in the cooling process. In one embodiment of the present invention, the cooling process is aided by the presence of cooling gasses that are added through injectors located in the cooling area of the furnace.

The cooling belt 20 passes through an unloading air baffle 50 which serves to seal off the tunnel from room air on the exiting side of the furnace in the same way as the loading baffle 30 on the entrance side. In an embodiment of the present invention, the cooling portion of the furnace has an exhaust duct and chimney 38 and drip pan 27 that is constructed and functions the same as the exhaust chimney 38 and drip pan 27 in the loading area, as described above. In one embodiment of the present invention, the different exhaust chimneys are used together. In an alternative embodiment of the present invention, only one of the two chimneys is used at a time. In yet another embodiment of the present invention, the use of chimneys is alternated so that the production is halted less often for cleaning of the drip pans.

Once the wafer travels through the unloading air baffle 50 the wafer is transported to an unloading station 52. Once the wafer reaches the unloading station, the wafer can either be removed from the cooling belt 20 by hand or automatically. In one embodiment of the present invention, the wafer is automatically placed into a cassette.

In an additional embodiment of the present invention, the infrared lamps provided above the hot belt 18 are used as cleaning lamps 54. The cleaning lamps 54 function as a cleaning device for the hot belt 18. When the cleaning lamps 54 are turned on they raise the temperature of the hot belt 18 to temperatures far higher than those necessary for reflowing the solder. The very high temperatures turn any flux residue into carbonized ash that is blown out of either exhaust chimney 38.

Thus, in an embodiment of the present invention, a second belt made of a dense stainless steel mesh functions as a hot plate when heated from below by infrared lamps. Furthermore, the use of a dense stainless steel mesh allows for rapid heat up and cool down, and the belt can be heated to various predefined temperatures in defined heating stages. Thus, the need for a large thermal mass as is used in hot plate technology is eliminated. Furthermore, by using thermocouples that are in contact with the belt being heated, accurate temperature readings are obtainable.

In an additional embodiment of the present invention, a single belt is used as the loading belt and the hot belt. Wafers are loaded onto the first belt which transports the wafer from a loading station through a baffle into a heating chamber having a controlled atmosphere and then through the heating chamber where the reflow process occurs. While transporting the wafer through the heating chamber, the first belt acts as a moving hot plate heating the wafer through conduction. Following the final heating stage the wafer is transferred from the first belt to the cooling belt.

In yet another alternative embodiment of the present invention more than three belts may be used. For example, more than one hot belt may move the wafer through the different stages in the heating chamber. By using multiple belts in the heating chamber, the speeds of the various belts can be varied and therefore, the time that the wafer spends in each heating zone may be manipulated.

The preceding description has been presented with reference to the presently preferred embodiment of the invention shown in the drawings. Workers skilled in the art and technology to which this invention pertains will appreciate that alterations and changes in the described structures can be practiced without departing from the spirit, principles and scope of this invention.

Accordingly, the foregoing description should not be read as pertaining only to the precise structure described, but rather should be read consistent with, and as support for the following claims.

What is claimed is:

1. An apparatus designed to process semi-conductor wafers comprising:
   an enclosure having top, bottom, and side walls and an entrance and an exit, wherein at least a portion of the top, bottom and/or side walls comprise porous insulation;
   a first belt system comprising one or more belts extending from a loading position outside the enclosure, through the entrance of the enclosure and through a portion of the enclosure, the first belt system having a loading end and an unloading end, at least one of the belts of the first belt system having a tight weave mesh;
   a second belt system comprising one or more belts extending from the unloading end of the first belt system and through the exit of the enclosure to an unloading position outside the enclosure, the second belt system having a loading end and an unloading end, at least one of the belts of the second belt system having a loose mesh weave; and
   one or more heating sources positioned below the first belt system for heating the first belt system.

2. The apparatus of claim 1, in which at least one of the heat sources is an infrared source and the weave of the first belt system is tight enough to block most of the radiation from the infrared heat source.

3. The apparatus of claim 1, in which the weave of at least one belt of the second belt system is loose enough to rapidly cool the wafers.

4. The apparatus of claim 1, in which at least one of the heat sources is an infrared source and the belts not below the infrared source have a looser weave than the one belt of the first belt system.

5. The apparatus of claim 1, in which the enclosure has a controlled atmosphere.

6. The apparatus of claim 1, in which the enclosure has one or more exhaust ducts.

7. The apparatus of claim 1, in which at least one of the heat sources is an infrared source and the first belt system comprises first and second separate belts coupled to each other so a wafer can be transported from one to the other, the first separate belt extends from the loading position to the infrared source and the second separate belt extends across the infrared source to the second belt system.

8. The apparatus of claim 7, in which the enclosure has a cooling zone and the second belt system extends from the second separate belt through the cooling zone to the unloading position.

9. The apparatus of claim 1, in which the enclosure has a cooling zone and the second belt system extends from the first belt system through the cooling zone to the unloading position.

10. An apparatus comprising:
    a heating enclosure;
    a cooling enclosure;
    a first belt system comprising one or more belts extending through the heating enclosure, the first belt system having a loading end and an unloading end;
    a second belt system comprising one or more belts extending through the cooling enclosure from a loading end to an unloading end, the unloading end of the first belt system leading to the loading end of the second belt system;
    wherein the heating enclosure includes one or more heating sources positioned adjacent the first belt system within the heating enclosure for heating the first belt system; and
    wherein the unloading end of the first belt system and the loading end of the second belt system lie within the cooling enclosure.

11. The apparatus according to claim 10, wherein at least some of the top, bottom, and side walls of the enclosure comprise porous insulation.

12. The apparatus according to claim 10, wherein the top, bottom, and side walls of the enclosure comprise porous insulation.

13. The apparatus according to claim 10, wherein the loading position is outside the enclosure and the first belt system extends through the entrance of the enclosure.

14. The apparatus according to claim 10, wherein the unloading position is outside the enclosure and the second belt system extends through the exit of the enclosure.

15. The apparatus according to claim 10, wherein the loading end of the second belt system is adjacent the unloading end of the first belt system so that can article carried by the first belt system can be moved onto the second belt system by the first belt system.

16. The apparatus of claim 10, wherein the second belt system comprises a single belt.

17. The apparatus according to claim 10, wherein the one or more heating sources comprise one or more infrared heating sources.

18. The apparatus according to claim 10, wherein at least some of the one or more heating sources are positioned below the first belt system.

19. The apparatus of claim 10, wherein the one or more heating sources heat the first belt system so that the portion of the first belt system in the enclosure nearest the entrance has a temperature lower than the unloading end of the first belt system.

20. The apparatus according to claim 10, further comprising infrared lamps positioned above the first belt system and capable of burning waste off of the first belt system.

21. The apparatus of claim 10, further comprising:
    a thermocouple coupled to the first belt system and capable of measuring the temperature of the first belt system; and a controller coupled to the thermocouple and capable of comparing a temperature measured by the thermocouple to a pre-specified temperature and adjusting the temperature of the heating source.

22. The apparatus of claim 10, wherein the first belt system passes lengthwise through a plurality of stages within the enclosure, wherein at least one heating source is provided in the enclosure in each stage, wherein the at least one heating source in one stage is capable of being controlled separately from the at least one heating source in a different stage.

23. The apparatus of claim 22, further comprising
a plurality of thermocouples coupled to the first belt system and capable of measuring the temperature of the first belt system, wherein at least one of the plurality of thermocouples is provided within each stage; and
a controller coupled to each thermocouple and capable of comparing a temperature measured by the coupled thermocouple to a pre-specified temperature and adjusting the temperature of the at least one heating source in the stage in which that thermocouple is provided.

24. The apparatus of claim 10, further comprising means for blowing a cooling gas onto the loading end of the second belt system to cool an article on the second belt system.

25. The apparatus of claim 10, wherein the one or more belts of the first belt system comprise a stainless steel mesh.

26. The apparatus of claim 10 further comprising:
a loading baffle at the entrance of the enclosure to prevent air from entering into the enclosure; and
an unloading baffle at the exit of the enclosure to prevent air from entering into the enclosure.

27. The apparatus of claim 10, further comprising an airtight casing surrounding the enclosure.

28. The apparatus of claim 10, in which the first belt system has a mesh construction.

29. The apparatus of claim 28, in which the second belt system has a mesh construction.

30. The apparatus of claim 29, in which the belt systems are made from stainless steel.

31. The apparatus of claim 10, in which the first belt system has a dense weave construction and the second belt system has a loose weave construction.

32. The apparatus of claim 31, in which the belt systems are made from stainless steel.

33. The apparatus of claim 28 in which at some of the one or more heating sources lie below the first belt system.

34. The apparatus of claim 23, additionally comprising baffles between the stages to isolate adjacent stages.

* * * * *

UNITED STATES PATENT AND TRADEMARK OFFICE
CERTIFICATE OF CORRECTION

PATENT NO. : 7,094,993 B2  Page 1 of 1
APPLICATION NO. : 10/968844
DATED : August 22, 2006
INVENTOR(S) : Carson T. Richert et al.

It is certified that error appears in the above-identified patent and that said Letters Patent is hereby corrected as shown below:

Column 2, line 44, "directed a" should read --directed to a --;

Column 4, line 12, "camber" should read --chamber--;

Column 5, line 55, "of belts," should read --of the belts, --;

Column 7, line 38 "63% lead" should read --63% tin--; and

Column 10, claim 15, line 44, "can article" should read --an article--.

Signed and Sealed this

Twelfth Day of June, 2007

JON W. DUDAS
*Director of the United States Patent and Trademark Office*